United States Patent [19]

Zweben et al.

[11] Patent Number: 4,888,247
[45] Date of Patent: Dec. 19, 1989

[54] LOW-THERMAL-EXPANSION, HEAT CONDUCTING LAMINATES HAVING LAYERS OF METAL AND REINFORCED POLYMER MATRIX COMPOSITE

[75] Inventors: Carl H. Zweben, Devon, Pa.; Rodman A. Mogle, Clinton, N.Y.; Benjamin T. Rodini, Jr., Wayne; Charles L. Thaw, Phoenixville, both of Pa.

[73] Assignee: General Electric Company, King of Prussia, Pa.

[21] Appl. No.: 900,984

[22] Filed: Aug. 27, 1986

[51] Int. Cl.$^4$ ............................................. B32B 5/16
[52] U.S. Cl. ................................. 428/105; 428/181; 428/139; 428/283; 428/285; 428/286; 428/294; 428/406; 428/408; 428/457; 428/461; 428/462; 428/422

[58] Field of Search ............... 428/283, 285, 457, 461, 428/408, 241, 244, 406, 252, 902, 294, 295, 131, 137, 75, 232, 105, 922, 286

[56] References Cited

U.S. PATENT DOCUMENTS

| | | | |
|---|---|---|---|
| 3,700,538 | 10/1972 | Kennedy | 428/241 |
| 3,778,334 | 12/1973 | Sturgeon | 428/285 |
| 4,029,838 | 6/1977 | Chamis et al. | 428/301 |
| 4,229,473 | 10/1980 | Elber | 428/113 |
| 4,307,147 | 12/1981 | Ohishi et al. | 428/268 |
| 4,318,954 | 3/1982 | Jensen | 428/241 |
| 4,326,238 | 4/1922 | Takedo et al. | 361/386 |
| 4,369,222 | 1/1983 | Hendrick et al. | 428/216 |
| 4,370,191 | 1/1983 | Uekita et al. | 428/458 |
| 4,372,804 | 2/1983 | Hanabusa et al. | 156/631 |
| 4,446,191 | 5/1984 | Miyadera et al. | 428/245 |
| 4,465,741 | 8/1984 | Yamatsuta et al. | 428/614 |
| 4,470,063 | 9/1984 | Arakawa et al. | 357/67 |
| 4,482,912 | 11/1984 | Chiba et al. | 357/67 |
| 4,489,123 | 12/1984 | Schijve et al. | 428/252 |
| 4,500,589 | 2/1985 | Schijve et al. | 428/252 |
| 4,550,051 | 10/1985 | Spielau et al. | 428/285 |
| 4,578,308 | 3/1985 | Hani et al. | 428/297 |
| 4,590,539 | 5/1986 | Sanjona et al. | 428/252 |
| 4,601,941 | 7/1986 | Lutz et al. | 428/213 |
| 4,637,851 | 1/1987 | Ueno et al. | 156/272.6 |
| 4,675,246 | 6/1987 | Kundinger et al. | 428/394 |
| 4,698,267 | 10/1987 | Tokansky | 428/413 |

FOREIGN PATENT DOCUMENTS 0147014 7/1985 European Pat. Off. .
1303301 1/1973 United Kingdom .

OTHER PUBLICATIONS

Miyadera et al., Low Expansion Coefficient Laminates, e.g. for Electronics—Made by Resin Impregnation of Composite Fabric; Ref. No. 72 on pp. 42–43 of Computer Printout.

Lindblom: "Copper Clad Invar" and Bulletin from Texas Instrument (circa 1983) Clad Metal Copper Clad Invar.

Leibowitz et al.: "A Coefficient of Thermal Expansion (C.T.E.) Controllable Family of Materials".

Primary Examiner—James J. Bell
Attorney, Agent, or Firm—Raymond E. Smiley; Clement A. Berard, Jr.

[57] ABSTRACT

Heat conducting laminates and laminated heat conducting devices having at least one layer of metal and at least one layer of polymer matrix composite material having low-thermal-expansion reinforcing material distributed throughout and embedded therein. The coefficient of thermal expansion and the thermal conductivity of the laminated heat conducting devices are defined by the metal in combination with the polymer matrix material and the low-thermal-expansion reinforcing material in the laminate. The coefficient of thermal expansion and thermal conductivity of a heat conducting device can be controlled by bonding at least one layer of metal to at least one layer of polymer matrix composite material having low-thermal-expansion reinforcing material distributed throughout and embedded therein. In one embodiment, the laminated heat conducting device comprises a plurality of alternating layers of aluminum and epoxy resin having graphite fibers distributed throughout the epoxy resin.

37 Claims, 5 Drawing Sheets

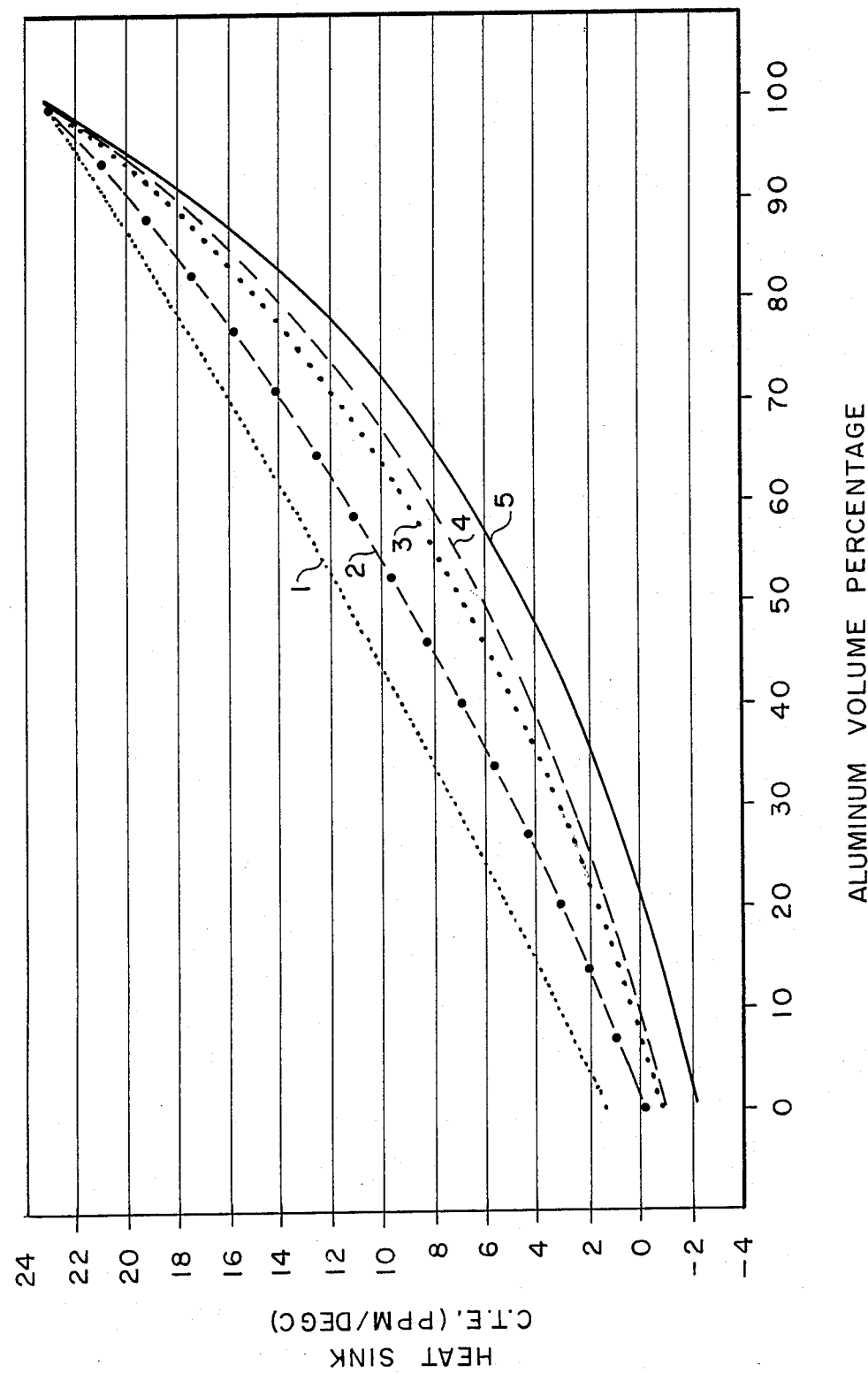

LOW-THERMAL-EXPANSION, HEAT CONDUCTING LAMINATES HAVING LAYERS OF METAL AND REINFORCED POLYMER MATRIX COMPOSITE

BACKGROUND OF THE INVENTION

The present invention relates to heat conducting laminates, and more particularly, to laminates having layers of metal and reinforced polymer matrix composite.

Heat sinks and other heat dissipating plates defined broadly herein as heat transfer devices, for electronic components and the like, are generally made from metals or metal alloys which have good thermal conductivity to permit good heat transfer from electronic components and devices, such as diodes and transistors. High temperatures resulting from the heavy current in diodes and heat generated in other electronic components require, in many cases, that heat sinks be used to draw the heat away from the electronic element or component. When heat sinks are not employed, various other devices have been designed to be attached directly to a heat dissipating plate or a chassis, which in turn will act as the heat transfer element.

In many of the foregoing cases, when the diodes and other electronic elements or components are attached to the heat sink or heat dissipating plate or other heat transfer device, problems arise because of the different coefficient of thermal expansion (CTE) of the various elements, for example, the difference in the coefficient of thermal expansion of the heat sink and the electrically insulating substrate to which the diode or transistor is attached, or the difference in coefficient of thermal expansion between the diode and the heat sink, and the like. When there is a significant difference in coefficient of thermal expansion between the components, temperature changes arising from soldering, and heat generated in the systems and from ambient conditions can cause large thermal stresses, resulting in failure of the components. Aluminum and copper are most frequently used as heat sinks and heat dissipating plates because they have good thermal conductivities, but the coefficient of thermal expansion of aluminum and copper are so high that heat or cold result in the separation of the heat transfer device from the next adjacent element which is usually made from a material having a lower coefficient of thermal expansion.

No single monolithic metal has a low coefficient of thermal expansion and a high thermal conductivity. The semiconductors and other critical elements and components used in electronic components, circuits or systems, such as silicon and gallium arsenide, are brittle, have low coefficients of thermal expansion and generate considerable waste heat in operation. Consequently, the minimum requirements for heat transfer devices for these components in electronic systems are low coefficient of thermal expansion and high thermal conductivity, and in most instances, such as in those cases where light weight is important such as space applications, low density is also a key consideration. Composite materials made from various substrates and organic polymer materials, such as laminates made of a paper substrate and a phenolic resin or a glass substrate and epoxy resin, as well as ceramic material such as alumina plates, have heretofore been used as substrates for printed wiring boards and heat sinks. However, the prior art suggests that these substrate materials are defective because of their low thermal conductivity and because of their inadequacy in transferring heat generated from such elements as integrated circuits, large-scale integrated circuits (LSI), power diodes and the like. Other laminates have also been developed in the form of laminates consisting of a metal base and an organic polymeric material or metal-ceramic composite plates, such as an electrical insulating alumilite film formed on an aluminum plate, however, these laminates are inadequate because of the thermal resistance due to the presence of the organic polymeric material or to the cracking of the alumilite film. Furthermore, in the foregoing materials, it is difficult to match or control the coefficient of thermal expansion of the plate.

In U.S. Pat. No. 4,307,147, there is described a thermally conductive and electrically insulating substrate which has a film composed of a dispersion of metal oxide particles with specified polyhedral shapes having specified shape factors in an adhesive organic polymer on a thermally conductive metal plate. In U.S. Pat. No. 4,307,147, the polyhedral-shaped metal oxide particles as well as the prior art irregularly-shaped particles, must be positioned on the metal plate in a face-to-face contact therewith. The thermally conductive and electrically insulating substrate of U.S. Pat. No. 4,307,147 used for the manufacture of wiring boards or heat discharge plates and the like is disadvantageous because it merely loosely positions metal oxide having flat surfaces or prior art metal oxides having irregularly-shaped surfaces against a metal plate and glues or fixes the metal oxide particles on the metal surface. Furthermore, the substrate formed in U.S. Pat. No. 4,307,147 is disadvantageous because it is difficult to match the coefficient of thermal expansion of the substrate to an adjacent component due to the positioning of the particles merely on the surface of the metal plate.

The matching of the coefficient of thermal expansion of the substrate to the next adjacent component in electronics devices is critical because it prevents structural and electrical failure during thermal cycling over the operational range of the components. Accordingly, it is desirable to match the coefficient of thermal expansion of the heat transfer device, such as a heat sink, to the coefficient of thermal expansion of the element or elements to which it is attached, and it is desirable to provide laminates which not only have excellent thermal conductivity but which also provide the capability of matching the coefficient of thermal expansion of adjacent elements From the foregoing, it can be seen that there is a need for heat sinks, heat dissipating plates and other heat transfer devices which have a low coefficient of thermal expansion and/or a tailored coefficient of thermal expansion as well as a high thermal conductivity.

SUMMARY OF THE INVENTION

Accordingly, it is the primary object of the present invention to provide heat sinks, heat dissipating devices and other heat transfer devices which overcome the foregoing disadvantages.

It is another object of the present invention to provide heat conducting laminates having a low coefficient of thermal expansion and/or a tailored coefficient of thermal expansion while maintaining high thermal conductivity.

It is another object of the present invention to provide heat conducting laminates having layers of reinforced polymer matrix and metals in which the coefficient of thermal expansion and the thermal conductivity are defined by the metal in combination with a polymer matrix material.

Still another object of the present invention is to provide a method of controlling the coefficient thermal of expansion and thermal conductivity of a heat transfer device.

Another object of the present invention is to provide a method of matching the coefficient of thermal expansion of thermally conductive heat transfer devices to the coefficient of thermal expansion of elements adjacent the heat transfer devices in electronic components.

It is a further object of the present invention to provide heat sinks, cold plates, heat dissipating devices and other heat transfer devices from layers of polymer matrix materials and metal.

These and other objects and advantages of the present invention will become apparent by those skilled in the art as the description thereof proceeds.

The foregoing objects are generally achieved by a laminate of at least one layer of polymer matrix composite material reinforced with low-thermal-expansion material and at least one layer of metal. The coefficient of thermal expansion and the thermal conductivity of the heat conducting laminate of the present invention is defined by the metal in combination with the polymer matrix material and the low-thermal-expansion reinforcing material integrally incorporated or embedded therein. The present invention provides a heat conducting laminate having at least one layer of metal and at least one layer of polymer matrix composite material having low-thermal-expansion reinforcing material integrally incorporated or embedded therein.

In accordance with the present invention, there is also provided a laminated heat conducting device by bonding or adhering at least one layer of metal and at least one layer of a polymer matrix composite material to each other, the polymer matrix material having low-thermal-expansion reinforcing material integrally incorporated in or embedded throughout the polymer matrix material, in which the coefficient of thermal expansion and the thermal conductivity of the device are defined by the metal in combination with the polymer matrix material and the low-thermal-expansion reinforcing material, the coefficient of thermal expansion of the laminated device being less than the coefficient of thermal expansion of the metal in the laminate due to the layer or layers of polymer matrix composite material bonded to the metal. The heat conducting laminates or the laminated heat conducting devices of the present invention can be assembled or fabricated to provide any appropriate coefficient of thermal expansion without substantial sacrifice of thermal conductivity using lower weight (lower density) materials. By varying the type of reinforcing material, such as organic or inorganic, by varying the form of reinforcing material, such as, fibers, whiskers, particles, fabric, mat and the like; by varying the ratio of the amount of reinforcing material to the amount of polymer matrix material; by varying the orientation of the reinforcing material in one or more layers of polymer matrix material relative to the orientation of the reinforcing material within another layer of polymer matrix material; and by varying the ratio of polymer matrix composite material to metal, heat conducting laminates and laminated heat conducting devices having a wide range of coefficient of thermal expansion and a wide range of thermal conductivities can be prepared by the present invention.

In accordance with another aspect of the present invention, there is provided a method of controlling the coefficient of thermal expansion and thermal conductivity of a heat conducting device comprising bonding at least one layer of metal to at least one layer of polymer matrix composite material having low-thermal-expansion reinforcing material integrally incorporated or embedded therein, whereby the coefficient of thermal expansion and thermal conductivity are defined by the metal in combination with the polymer matrix composite material and the low-thermal-expansion reinforcing material dispersed throughout the polymer matrix.

By the method, heat conducting composites and laminated heat conducting devices of the present invention, it is possible to provide heat sinks, heat dissipating plates and devices, heat discharge plates, cold plates, wiring boards, chassis, and other heat transfer devices in the field of electronics so that the particular device has a specified coefficient of thermal expansion as well as a specified thermal conductivity.

These and various other objects, features and advantages of the invention can be best understood from the following detailed description taken in conjunction with the accompanying drawings in which:

BRIEF DESCRIPTION OF THE DRAWINGS

FIG. 9 is a graphical representation of the coefficient of thermal expansion (C.T.E.) as a function of aluminum in a laminate of aluminum and epoxy having graphite fibers of various modulus incorporated in the epoxy.

DETAILED DESCRIPTION OF THE INVENTION

Figure 1:
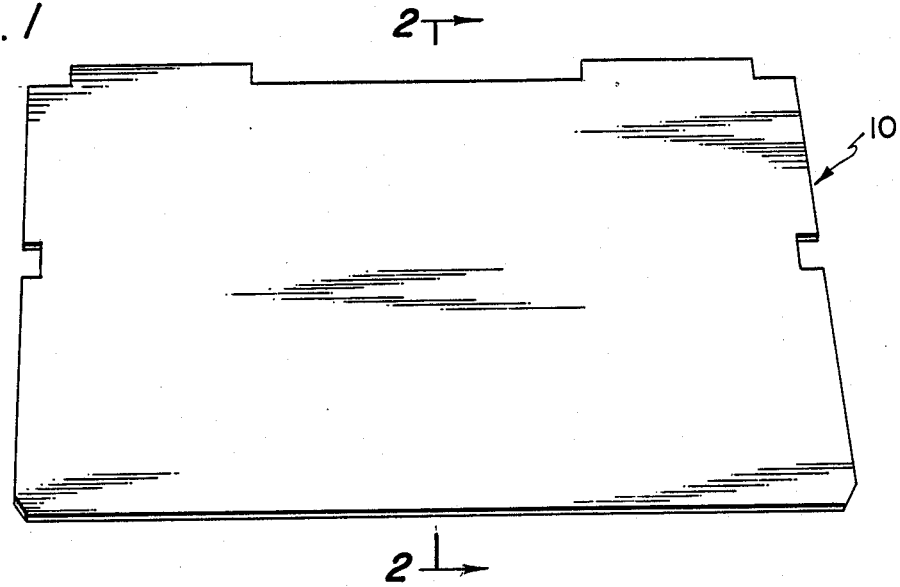
FIG. 1 is a perspective view of a laminated heat sink according to the present invention.

The heat conducting laminates and laminated heat conducting devices of the present invention are fabricated from at least one layer of metal and at least one layer of polymer matrix composite material having low-thermal-expansion reinforcing material integrally incorporated or embedded therein in such a manner that the reinforcing material is distributed throughout the polymer matrix for effective heat transfer, for effective control of coefficient of thermal expansion, for effective bonding of layers and for improved strength within the laminate. The laminates of the present invention are made by bonding layers of composite to layers of metals. It has been found that heat conducting laminates are thermally conducting by dispersing the reinforcing material throughout the polymer matrix without directly contacting all of the reinforcing material of the composite with the surface of the metal. The laminated heat conducting devices of the present invention which can be tailor-made to have a coefficient of thermal expansion which matches the coefficient of thermal expansion of an adjacent element in an electronic component, are fabricated from at least one layer of metal and at least one layer of a polymer matrix composite material when the polymer matrix composite material has low-thermal-expansion reinforcing material integrally incorporated or embedded therein. As used herein, the reinforcing material is integrally incorporated or embedded in the polymer matrix when it is distributed throughout the polymer matrix to form a polymer matrix composite.

In the laminated heat conducting devices of the present invention, the form of the low-thermal-expansion reinforcing material incorporated or embedded in the polymer matrix material is not critical as long as the coefficient of thermal expansion and the thermal conductivity of the device can be defined by the metal in combination with the polymer matrix material and the low-thermal-expansion reinforcing material, and as long as the coefficient of thermal expansion of the laminated device is less than the coefficient of thermal expansion of the layer or layers of metal or metal alloys in the laminated device. The laminated heat conducting devices can be fabricated from polymer matrix composite materials wherein the low-thermal-expansion reinforcing material is in the form of particles including powders, fibrous materials, including whiskers, fibers, woven fabrics, non-woven mats and other woven and non-woven materials, and the like or any combination thereof.

By the heat conducting laminates, the laminated heat conducting devices and the methods of the present invention, heat transfer devices can now be made which have significant advantages over the heat transfer devices of the prior art which are made of materials such as metals and metal alloys and certain laminates. By choosing appropriate combinations of layers of metals or metal alloys, polymer matrix materials and low-thermal-expansion reinforcing materials, heat transfer devices, such as heat sinks, cold plates, heat dissipating plates, and the like, can be tailored to provide specific combinations of coefficient of thermal expansion, thermal conductivity and density, the coefficient of thermal expansion of which substantially matches the coefficient of thermal expansion of other elements adjacent thereto. By matching the coefficient of thermal expansion of the heat transfer device to a substrate or other adjacent element, the thermally induced stresses normally encountered between heat transfer devices and adjacent elements within an electronic or microwave circuit, module or system are reduced or eliminated, and structural and electrical failure during thermal cycling over the expected temperature range for all elements in a component, are prevented.

The particular metal or metal alloy used for the layer of metal or layers of metal in the heat conducting laminates and in the laminated heat conducting devices of the present invention are not critical and may be any thermally conducting metal or metal alloy which forms a sheet, film or foil. A metal or metals may be selected for the laminated heat conducting devices and heat conducting laminates of the present invention because they exhibit a particular coefficient of thermal expansion since the thermal conductivity of the laminated heat conducting devices of the present invention are defined by the metal in combination with the polymer matrix material and the low-thermal-expansion reinforcing material. The metal sheets, films or foils used in the laminate generally include aluminum, copper, silver, nickel, titanium, iron, gold, tin, beryllium, magnesium, lead and various alloys, such as iron-nickel, iron-nickel-cobalt and the like. Any metal or metal alloy which can be formed into a thin sheet, foil or film; which can be bonded to the polymer matrix composite materials of the present invention; and which transfers or conducts heat, can be used in the laminates, devices and methods of the present invention.

The thickness of the metal sheets is not critical as long as the heat conducting laminate or laminated heat conducting device has a sufficient amount of metal sheet, film or plate in the form of at least one layer in the laminate or device to permit the transfer of heat in the laminate or the device. Generally, the amount of metal in the form of sheet, film or plate is designated herein as volume percent. It has been found in accordance with the present invention that the amount of metal in the form of at least one layer of metal in the heat conducting laminates and laminated heat conducting devices of the present invention is from about 10 volume percent to about 75 volume percent in preferred embodiments and about 25 volume percent to about 60 volume percent in the more preferred embodiments. However, it is possible to provide greater or lesser amounts of metal in at least one layer of metal in the heat conducting laminates and laminated heat conducting devices of the present invention, and the foregoing designated amount of metal is not meant to be limiting. Generally, the balance of the laminates of the present invention is polymer matrix composite material and optionally, adhesive bonding agent.

Although there is no limitation upon the thickness of the layer or layers of metal in the heat conducting laminates and laminated heat conducting devices of the present invention, thin sheet material or foils are to be preferred to thick sheet material because thin sheet material is less likely to separate from the other elements of the laminate or heat conducting device due to fatigue and/or use. The use of thin sheet material or foil minimizes thermal stresses which tend to cause delamination. In most preferred embodiments of the present invention, each layer of metal is a metal sheet or film having a thickness less than about 1.0 cm, and more particularly, from about 0.05 mm to about 10.0 mm.

Although there is no limit to the number of metal sheets or layers which may be used in accordance with the present invention, the heat conducting laminates and laminated heat conducting devices of the present invention must have at least one layer of metal. In preferred laminated heat conducting devices of the present invention, there are a plurality of layers of metal distributed within the laminate, and in certain preferred embodiments, the layers of metal alternate with the layers of polymer matrix composite material. Although in most embodiments, the laminated heat conducting devices have a plurality of metal layers wherein each layer of metal is the same type of metal and each layer of metal is the same thickness, it is within the scope of the present invention to provide laminated heat conducting devices having a plurality of metal layers wherein at least two of the metal layers are different metals and/or wherein at least two of the metal layers are of different thicknesses, for example, alternating layers of aluminum and copper having polymer matrix composite material layers positioned therebetween. Furthermore, it is within the scope of the present invention to provide a plurality of metal layers adjacent to each other in the heat conducting laminates and laminated heat conducting devices. For example, a laminated heat conducting device may have a layer of polymer matrix composite material bonded to a layer of aluminum which in turn is bonded to a second layer of aluminum and thereafter bonded to a layer of polymer matrix composite material and the like. Although there is generally no limit to the number of layers of metal to be used, the number metal sheets is generally not more than about 30.

Critical in the practice of the present invention is the bonding of at least one layer of polymer matrix composite material to at least one layer of metal. As used herein, polymer matrix composite material is defined as a polymer material having a low-thermal-expansion reinforcing material integrally incorporated or embedded therein. Thus, the composite comprises the polymer and the reinforcing material wherein the reinforcing material forms an integral part of the composite, that is, the reinforcing material is distributed throughout the polymer matrix, and the reinforcing material and the polymer matrix form a distinct composite layer which is bonded to a layer or layers of metal.

The polymer matrix material is not generally critical and may be any polymer material which can withstand the transfer of heat therethrough while maintaining its integrity during periods of use and non-use, including periods when the heat conducting laminate or laminated heat conducting device are exposed to ambient or to below-ambient temperatures. Generally, the polymer material is expected to withstand temperatures ranging from about $-55°$ C. up to about $100°$ C. and higher, depending upon its particular end-use and the particular device in which it is incorporated. The polymer matrix material having the reinforcing material integrally incorporated therein, must be one which is suitable for bonding to at least one metal layer either with or without the use of bonding agents. Many of the thermosetting resins can be used as the polymer matrix material, and one skilled in the art can choose an appropriate thermosetting resin or other suitable polymer or copolymer material as the polymer matrix material without undue experimentation by examining the thermal and bonding properties of the particular polymer or copolymer material, and by examining its compatibility with the reinforcing material. Examples of polymers which are useful in the polymer matrix composite materials of the present invention include polyesters, polyurethanes, polysiloxanes, epoxys, polyimides, polyamides, bis-maleamides and polybenzothiazole (PBT).

The thickness of the layer or layers of polymer matrix material is not critical in the heat conducting laminates or laminated heat conducting devices of the present invention. In most embodiments of the present invention, each layer of polymer matrix material has a thickness less than about 1.0 cm, and more particularly, from about 0.2 mm to about 10.0 mm. Generally, the amount of polymer matrix material is designated herein as volume percent and is generally substantially the balance of the laminate over the amount of metal or metal alloy in the laminate. Thus, if the metal or metal alloy in the laminate is 20 volume percent, the balance of the laminate is attributed to the polymer matrix composite less any bonding agent, if any, used to bond the metal to the polymer matrix composite. If the layer or layers of metal or metal alloy represent 75 volume percent of the laminate, then the polymer matrix composite material is 25 volume percent of the laminate less bonding agent, if any. However, it is possible to provide greater or lesser amounts of polymer matrix composite material, depending upon the amount of metal or metal alloy used in the laminate.

Although there is no limit to the number of layers of polymer matrix composite material which may be used in accordance with the present invention, the heat conducting laminates and laminated heat conducting devices of the present invention must have at least one layer of polymer matrix composite material comprising polymer matrix and low-thermal-expansion reinforcing material incorporated or embedded therein. In preferred laminated heat conducting devices of the present invention, there are a plurality of layers of polymer matrix composite material distributed within the laminate, and in certain preferred embodiments, the layers of polymer matrix composite material alternate with the layers of metal. Although in most embodiments, the laminated heat conducting devices have a plurality of layers of polymer matrix composite material wherein each layer of polymer matrix composite material is the same type, and each layer of polymer matrix composite is the same thickness, it is within the scope of the present invention to provide laminated heat conducting devices having a plurality of layers of polymer matrix composite material wherein at least two of the polymer matrix materials are different materials and/or wherein at least two of the layers of polymer matrix material are of different thicknesses, for example, alternating layers of a polyester composite and a polyurethane composite having layers of metal or metal alloy positioned therebetween. Furthermore, it is within the scope of the present invention to provide a plurality of layers of polymer matrix composite material adjacent each other in the heat conducting laminates and laminated heat conducing devices. For example, a laminated heat conducting device may have a layer of polyester having a reinforcing material embedded therein which in turn is bonded to a second layer of polyester having a reinforcing material embedded therein and thereafter bonded to a layer of aluminum, and the like. Although there is generally no limit to the number of layers of polymer matrix composite material to be used in the laminates of the present invention, the number of layers of polymer matrix composite material is generally not more than about 30.

In those embodiments of the present invention having a plurality of layers in the heat conducting laminates or laminated heat conducting devices, the outside layers or end layers of the laminate or device are not critical, and it is within the scope of the present invention to provide laminates wherein the two outermost layers are metal and/or metal alloys, wherein the two outermost layers are polymer matrix composite materials, and/or wherein one outermost layer is a layer of metal or metal alloy and the other outermost layer of the laminate is a polymer matrix composite material. The choice of the outermost layers in the heat conducting laminates and laminated heat conducting devices of the present invention is dependent upon the particular use for the laminate or device and can be easily chosen by one skilled in the art.

The polymer matrix material used in the heat conducting laminates and laminated heat conducting devices of the present invention can be formed into the laminates by using preimpregnated sheets or films of the polymer matrix material with the low-thermal-expansion reinforcing material integrally incorporated or embedded therein, or the polymer matrix composite material can be formed into the heat conducting laminate or laminated heat conducting devices of the present invention by using uncured layers of polymer matrix composite material including, but not limited to, liquid polymer materials, having the low-thermal-expansion reinforcing material deposited, placed or otherwise embedded therein, wherein the uncured polymer matrix composite material is cured after the layer or layers of metal or metal alloy and polymer matrix composite materials are stacked in the desired layers. Both pre-cured and uncured polymers can be utilized as polymer matrix material, and various types of cure and/or post-cure techniques can be utilized in the present invention. Preimpregnated sheets or films are commonly referred to as a "prepregs" which are defined as resin preimpregnated materials that may be temperature cured to provide a rigid composite structure. Various commercial "prepregs" of carbon fibers in an epoxy resin matrix system are currently commercially available as described in U.S. Pat. No. 4,229,473. In all instances, the reinforcing material must form an integral part of the polymer matrix composite to improve the bonding of the layers and to improve the strength of the laminate. The integral relationship between the reinforcing material and the polymer matrix material is critical because it eliminates the prior art problems where particles are glued against the metal layer.

The reinforcing material which must be used in conjunction with the polymer matrix material in the heat conducting laminates and laminated heat conducting devices of the present invention, is critical, and must be selected to provide a laminated heat conducting device in which the coefficient of thermal expansion and the thermal conductivity of the device are defined by the metal in the laminate in combination with the polymer matrix material in the laminate and the low-thermal-expansion reinforcing material within the polymer matrix material. The control of the coefficient of thermal expansion of the laminated heat conducting devices of the present invention is significantly dependent upon the low-thermal-expansion reinforcing material integrally embedded or incorporated in the polymer matrix material, and the coefficient of thermal expansion of the layer or layers of metal or metal alloys is dependent upon and reduced by the polymer matrix composite material adhered to the metal. Thus, in accordance with the present invention, it is critical that the reinforcing material integrally embedded in or incorporated in the polymer matrix material be a low-thermal-expansion material, that is, one which has a coefficient of thermal expansion less than the coefficient of thermal expansion of the metal or metal alloy in the laminate.

The form or shape of the low-thermal-expansion reinforcing material embedded in or incorporated in the polymer matrix material to form the polymer matrix composite material of the laminated heat conducting devices of the present invention is not critical, and may be in the form of particles, including powders, whiskers, fibers, woven fabrics, non-woven mats or any other woven or non-woven form of fiber, or any combination of the foregoing. The particles, whiskers, fibers, fabrics, mats, and the like must be capable of forming an integral mixture with, must be capable of being distributed throughout, or must be capable of being integrally embedded or incorporated in the polymer matrix material so that the reinforcing material is distributed within the polymer matrix material and does not merely form a layer of reinforcing material on the surface of the metal wherein the reinforcing material is merely glued to the metal layer. Furthermore, the particular reinforcing material must not interfere with the electrical properties or any other properties of the electronic component or other type of component in which it is ultimately utilized in the form of a heat transfer device.

When the low-thermal-expansion reinforcing material integrally incorporated in and distributed throughout the polymer matrix material is inorganic fibers, examples of the inorganic fibers include those which are made from carbon, graphite, boron, alumina, silicon carbide, boron carbide, boria, boron nitride, silica, titanium diboride, beryllium, quartz, alumina-boria silica and mixtures thereof. Inorganic whiskers which may be integrally incorporated in and distributed throughout the polymer matrix material as the low-thermal-expansion reinforcing material, include carbon, graphite, boron, alumina, silicon carbide, boron carbide, boria, boron nitride, silica, titanium diboride, beryllium, quartz, alumina-boria silica, silicon nitride, nickel aluminide and mixtures thereof. Inorganic particles which may be integrally incorporated in and distributed throughout the polymer matrix material as the low-thermal-expansion reinforcing material to form the polymer matrix composite, and which in combination with the polymer matrix material and the metal in the laminate modify the coefficient of thermal expansion of the laminated heat conducting devices of the present invention, include carbon, graphite, boron, alumina, silicon carbide, boron carbide, boria, boron nitride, silica, titanium diboride, beryllium, quartz, alumina-boria silica, nickel aluminide, silicon nitride, beryllium oxide, aluminum nitride, titanium carbide, aluminum dodecaboride, tungsten carbide, chromium carbide, molybdenum disilicide, hollow glass spheres, hollow quartz spheres, hollow graphite spheres and mixtures thereof.

Organic fibers and/or organic whiskers can also be used as the low-thermal-expansion reinforcing material integrally incorporated in and distributed throughout the polymer matrix material to form the polymer matrix composite used in the heat conducting laminates of the present invention. Organic fibers and organic whiskers include polyaramid fibers and whiskers and PBT fibers and whiskers. Polyaramid fibers or yarns or reinforcing plastics are well-known in the art and are more particularly referred to as poly-paraphenylene terephthalamide. Other organic fibers and whiskers include those made from aromatic polyamide hydrazides and aromatic polyesters.

It is also within the scope of the present invention to provide heat conducting laminates and laminated heat conducting devices wherein the polymer matrix material and the low-thermal-expansion reinforcing material embedded or incorporated therein to form the polymer matrix composite material is the same polymer. Such polymers are known in the art as ordered polymer films, and the low-thermal-expansion reinforcing material within such a polymer film consists of oriented portions of the polymer itself integral to the polymer film and distributed throughout the polymer film. It is the greater concentration of the polymer material itself and/or higher molecular weight segments of the polymer material itself within the sheet or film of polymer which provides the reinforcement within the film and from which the designation "ordered polymer film" is derived. Examples of ordered polymer films include polyaramids and PBT films.

The low-thermal-expansion reinforcing material incorporated in the polymer matrix material to form the polymer matrix composite material may be randomly distributed throughout the polymer matrix, or it may be distributed in a unidirectional orientation throughout the polymer matrix. Thus, the fibers, whiskers, particles or other forms of reinforcing material may be randomly distributed, or they may be distributed in the unidirectional orientation thereof as long as they form an integral part of and are distributed throughout the polymer matrix composite material. In certain instances, the same laminated heat conducting device may contain a plurality of layers of polymer matrix composite materials wherein the low-thermal-expansion reinforcing material has a unidirectional orientation in certain designated layers and wherein the low-thermal-expansion reinforcing material is randomly distributed in the polymer matrix material in at least one of the layers of the laminate. As used herein, the term "unidirectional" designates the orientation of the reinforcing material as being substantially all in the same direction within a particular sheet, film or layer of polymer matrix material, that is, the fibers, whiskers and/or particles are essentially aligned in the same direction within the polymer.

When the low-thermal-expansion reinforcing material in the polymer matrix composite material layer has a unidirectional orientation, the layers of polymer matrix composite material in a laminated heat conducting device having a plurality of polymer matrix composite material layers can be positioned such that at least one of the polymer matrix composite material layers is aligned at an angle up to 90° relative to the low-thermal-expansion reinforcing material of at least one other polymer matrix composite material layer. In certain preferred embodiments, the low-thermal-expansion reinforcing material in one layer is in an orthogonal orientation, that is, at an angle 90°, relative to the low-thermal-expansion reinforcing material of another layer. In accordance with the present invention, laminated heat conducting devices can be provided having any crossply orientation within the laminate as desired.

In certain preferred embodiments of the present invention, it is desirable to provide low-thermal-expansion reinforcing material which is thermally conductive in at least one layer of polymer matrix composite material. Examples of thermally conductive, low-thermal-expansion reinforcing material include whiskers, fibers, fabrics, mats, particles and any combination thereof and the like made from carbon, graphite, boron, alumina, silicon carbide, titanium diboride, beryllium, nickel aluminide, aluminum nitride, aluminum dodecaboride, molybdenum disilicide, hollow graphite spheres and the like and mixtures thereof. In one preferred embodiment, the high thermally conductive reinforcing material is carbon fiber, such as, pitch based carbon fibers supplied by Union Carbide under the trade name "P-fiber". When the thermally conductive, low-thermal-expansion reinforcing material is aligned in the polymer matrix composite material, that is, when it is in a unidirectional orientation, then the polymer matrix composite material directs heat in the direction of the alignment of the reinforcing material. Thus, in certain preferred embodiments of the present invention, laminated heat conducting devices and heat conducting laminates can be fabricated which direct heat in a given direction because of the particular alignment of the thermally conductive, low-thermal-expansion reinforcing material within the polymer matrix composite material in the laminate.

Laminated heat conducting devices having a plurality of polymer matrix composite material layers can have at least two of the polymer matrix material layers with different low-thermal-expansion reinforcing materials embedded or incorporated therein.

The amount of fibers, whiskers, fabric, mat, particles, and the like or mixtures thereof integrally incorporated or embedded in the polymer matrix material to form the polymer matrix composite material used in the laminated heat conducting devices of the present invention must be a sufficient amount to modify the coefficient of thermal expansion of the polymer matrix material and the metal in the heat transfer device for electronic and other components when the layer or layers of metal or metal alloy are bonded to the layer or layers of polymer matrix composite material. The amount of fibers, whiskers, fabric, mat, particles, and the like, or mixtures thereof which are thermally conductive and which are incorporated in the polymer matrix material to form the polymer matrix composite material, must be a sufficient amount to provide the desired thermal conductivity of the polymer matrix composite material in those instances when the polymer matrix composite material is one which has enhanced thermal conductivity. It is also important that the amount of fibers, whiskers, fabric, mat, particles and the like and mixtures thereof not interfere with any of the electrical properties of the electronic or other component in which the laminated heat conducting device or heat conducting laminate is incorporated.

Generally, from trace amounts up to 75 volume percent of the polymer matrix composite material may include the low-thermal-expansion reinforcing material. In certain aspects of the present invention, the low-thermal-expansion reinforcing material incorporated in the polymer matrix material, comprises about 0.01 volume percent to about 75 volume percent of the polymer matrix composite material. Generally, there is no advantage in having the low-thermal-expansion reinforcing material incorporated in the polymer matrix material in excess of about 75 volume percent of the polymer matrix composite material, and in certain cases, amounts of reinforcing material in excess of 75 volume percent can compromise the integrity of the polymer matrix composite material, which in turn, compromises the integrity of the heat conducting laminate or laminated heat conducting device and thermally conducting heat transfer devices for electronic components. Furthermore, in certain instances, it may be too difficult to disperse or incorporate large amounts of the reinforcing material in the polymer matrix material because localized effects may result therefrom. If too little reinforcing material is incorporated in the polymer matrix material, then the desired coefficient of thermal expansion, and in certain instances the desired thermal conductivity, may not be achieved.

The size of the particles, whiskers, fibers, fabrics and mats used in the polymer matrix composite materials is not critical. The sizes of the reinforcing materials generally have no lower limits because the smallest particles, whiskers, fibers, fabrics, mats and the like can be incorporated in the polymer matrix material. The upper limit of the size of particles, fibers, whiskers, mats, fabrics and the like may generally be considered in terms of the thickness of the layer of polymer matrix composite material having the reinforcing material distributed throughout. Generally, the diameter of any fiber, whisker, particle and the thickness of any fabric or mat, whether continuous or discontinuous, should be no greater than about one-tenth the thickness of the layer of polymer matrix material in which it is incorporated to satisfy the preferred embodiments of the present invention. However, it is within the scope of the present invention to incorporate reinforcing materials having thicknesses and/or sizes up to the approximate thickness of the layer of polymer matrix composite material in which it is incorporated, as long as the reinforcing material is an integral part of the polymer matrix material and does not form a separate layer or entity on the surface of the metal. As used herein, particle means any shape and/or size of particulate material, including powders, and fiber or fibrous material means any reinforcing material which is a fiber or whisker or which is derived from fibers or whiskers including woven fabric, non-woven mat and any other form of woven and non-woven material.

Since the coefficient of thermal expansion of the metal in the heat conducting laminates and laminated heat conducting devices of the present invention is reduced by bonding at least one layer of metal and at least one layer of polymer matrix composite material having low-thermal-expansion reinforcing material incorporated or embedded therein, the bonding of the layers must be sufficient to maintain the integrity of the joined layers at various temperatures and under varying conditions. When adhesive agents are used to bond the various layers in the laminates of the present invention, generally adhesive organic polymers are used for such purpose, for example, epoxy resins, phenolic resins and the like. In certain cases, the polymer matrix material itself or the polymer matrix material and additional or supplemental adhesive agent are used as the bonding agent, and the assembled laminate is subjected to heat and/or pressure to bond the various polymer matrix composite layers to each other and/or to the layers of metal. As indicated above, the pre-cured polymer matrix material having the low-thermal-expansion reinforcing material distributed throughout, generally but not necessarily, in the form of "prepreg" is placed in the appropriate layers in the stack forming the laminate, and thereafter cured by the application of heat, curing agent and/or pressure to cure the polymer and to form the required bond between the layers of metal or metal alloy and polymer matrix composite material. In certain instances the uncured polymer in the form of a liquid or B-staged polymer is utilized in making the laminates of the present invention. For example, the low-thermal-expansion reinforcing material is placed in the uncured polymer; layers of metal and the uncured polymer are then formed, and thereafter the polymer is cured by well-known curing techniques. Variations of the foregoing and post-curing techniques may also be utilized by one skilled in the art. Supplemental adhesive agents may be utilized when the foregoing method is utilized to make the low-thermal-expansion, heat conducting laminates of the present invention.

Various bonding agents (adhesives) and bonding techniques can be used by one skilled in the art to form the laminated heat conducting devices and heat conducting laminates of the present invention. The amount of adhesive material applied to join layers of the laminates of the present invention is not critical as long as a sufficient amount is applied to maintain the integrity of the laminate under all conditions whether on the shelf or used in various electronic and other components. In certain instances, thermal stresses can be minimized in laminates by bonding the layers within the laminate at a temperature that is near the mid-point of the temperature range of use, and accordingly, one skilled in the art can determine these particular parameters when considering the thermal stresses to which the laminate will be subjected during its use in an electronic component or other heat transfer device. As indicated above, the layers of polymer matrix composite and metal are thin and are interleaved or alternate in certain preferred embodiments to provide the heat transfer devices of the present invention. By utilizing thin sheets of films of the composite material and metal and by alternating or interleafing the layers, there is a tendency to minimize the debonding of the layers. It is also possible to perforate one or more layers in the laminate to minimize the tendency of the layers to debond. Perforations can be provided by one skilled in the art, for example, as shown in the laminates discussed in U.S. Pat. No. 4,229,473.

As indicated above, the heat conducting laminates and laminated heat conducting devices of the present invention can be fabricated or manufactured so that the coefficient of thermal expansion of the heat conducting laminate or laminated heat conducting device matches the coefficient of thermal expansion or the next adjacent element in an electronic circuit or system or a similar circuit or system in other components. By matching the coefficient of thermal expansion of heat transfer devices to the coefficient of thermal expansion of the next adjacent elements thereto in various systems, such as electronic systems, circuits and modules, reduces the thermally induced stresses which often lead to premature component failure. With the heat conducting laminates and laminated heat conducting devices of the present invention, not only is there a matching or substantial matching of the coefficients of thermal expansion of the adjacent elements, but there is also provided a heat transfer device having high thermal conductivity and generally low density. The lower material density directly impacts the weight of the component and can result in substantial improvements and savings in electronic components and devices. As used herein, by matching the coefficient of thermal expansion of elements adjacent to heat transfer devices in electronic or similar components means to produce a heat transfer device or laminated heat conducting device having a small difference in coefficient of thermal expansion, or so that there is less difference in the coefficient of thermal expansion between the particular heat transfer device or laminated heat conducting device and the next adjacent element. For example, when the coefficient of thermal expansion (CTE) of a heat transfer device, such as a heat sink, only varies about 2 to $5 \times 10^{-6}$ in/in/° F. from the coefficient of thermal expansion of the element adjacent thereto, it is said to match or substantially match the coefficient of thermal expansion of that element. In accordance with the present invention, the coefficient of thermal expansion of the heat transfer device or laminated heat conducting device can also be said to match the coefficient of thermal expansion of the element adjacent thereto when the thermal expansion of the two elements is such that thermal stresses do not result in failure of the components. Thus, the variation in coefficient of thermal expansion between the two elements can be even greater than $5 \times 10^{-6}$ in/in/° F. if thermal stresses do not result in the failure of the components.

In the broadest aspects of the present invention, there is no upper limit set for the variation in coefficient of thermal expansion between the heat transfer device and the element adjacent thereto, it being within the scope of the present invention to adjust the coefficient of thermal expansion of the heat transfer device so that it more closely matches the coefficient of thermal expansion of the adjacent element or elements. Differences in coefficient of thermal expansion have been minimized by using the methods and laminated heat conducting devices of the present invention. In one aspect of the present invention, there is provided a method of fabricating thermally conducting heat transfer devices for electronic components, the heat transfer devices having a coefficient of thermal expansion substantially matching the coefficient of thermal expansion of elements adjacent the heat transfer device in the electronics components, comprising providing at least one metal or metal alloy sheet material; providing at least one layer of polymer matrix material having low-thermal-expansion reinforcing material integrally incorporated or embedded therein; varying the low-thermal-expansion reinforcing material in the polymer matrix material to modify the coefficient of thermal expansion of the polymer matrix material and the heat transfer device; and bonding the metal to the polymer matrix material having the low-thermal-expansion reinforcing material therein to form a laminate whereby the coefficient of thermal expansion of the polymer matrix material having the low- thermal-expansion reinforcing material incorporated or embedded therein in combination with the metal in the heat transfer device substantially matches the coefficient of thermal expansion of the element adjacent thereto. The foregoing method of fabricating thermally conducting heat transfer devices for electronic components and similar components also embraces varying the ratio of the polymer matrix composite material to the metal in the laminate to modify the coefficient of thermal expansion and the thermal conductivity of the heat transfer device. In preferred embodiments, the metal comprises from about 10 volume percent to about 75 volume percent of the laminate or heat transfer device.

The low-thermal-expansion reinforcing material in the polymer matrix material can be varied in several ways. The low-thermal-expansion reinforcing material in the polymer matrix material can be varied by selecting a particular reinforcing material form or forms, such as, fibers, whiskers, particles, non-woven mats, woven fabrics and the like and mixtures thereof. The low-thermal-expansion reinforcing material in the polymer matrix material can also be varied by varying the ratio of the amount of reinforcing material to the amount of polymer matrix material to modify the coefficient of thermal expansion of the polymer matrix material and the laminated heat conducting device. For example, the reinforcing material can be varied from about 0.01 volume percent to about 75 volume percent of the composite to modify the coefficient of thermal expansion. The low-thermal-expansion reinforcing material can be varied in the polymer matrix material to modify the coefficient of thermal expansion of the polymer matrix material and the laminated heat conducting device or heat transfer device by aligning the reinforcing material embedded in the polymer matrix material at an angle up to 90° relative to the low-thermal-expansion reinforcing material of at least one other layer of polymer matrix material in the laminated heat conducting devices and heat transfer devices having at least two polymer matrix composite material layers.

The laminated heat conducting devices or heat transfer devices of the present invention can be used for almost any elements or components of electronics modules, circuits or systems where transfer of heat is required. They can also be used as elements or components in various other systems, such as microwave systems. For example, they can be used as heat sinks, cold plates, chassis materials, heat dissipating plates, and the like.

Referring to the drawings, FIG. 1 illustrates a laminated heat sink having alternating layers of epoxy resin with graphite fibers integrally embedded therein, that is, distributed throughout the polymer matrix, and thin sheets of aluminum. Heat sink 10 was bonded to a printed wiring board on which were mounted leadless ceramic chip carriers (LCC) (not shown).

Figure 2:
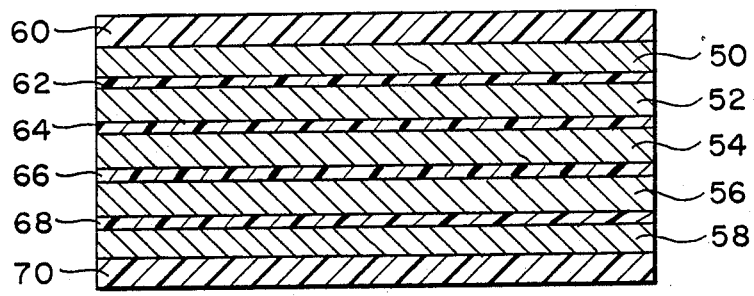
FIG. 2 is an enlarged sectional view taken along line 2—2 of FIG. 1.

FIG. 2 is a cross section of heat sink 10 of FIG. 1 and illustrates the various layers in the laminate. The heat sink of FIGS. 1 and 2 represents those embodiments of the present invention wherein the metal layers 50, 52, 54, 56 and 58 are bonded to layers 60, 62, 64, 66, 68 and 70 of polymer matrix composite material having low-thermal-expansion reinforcing material integrally embedded therein by laminating the layers of metal with pre-cured layers of polymer matrix composite material having the low-thermal-expansion reinforcing material integrally embedded therein and thereafter curing the polymer matrix composite material. In the embodiment of a non-symmetrical laminate shown in FIG. 2, alternating layers 50, 52, 54, 56 and 58 of aluminum having a thickness of about 8 mils (0.20 mm) were bonded to layers 60, 62, 64, 66, 68 and 70 of epoxy resin having graphite fibers distributed throughout the epoxy resin. Layers 62, 64, 66 and 68 have a thickness of about 5 mils (0.127 mm) with outer layers 60 and 70 of epoxy resin/graphite fiber composite having two orthogonal plies each having a thickness of about 5 mils (0.127 mm) to form the laminate for the heat sink.

Figure 3:
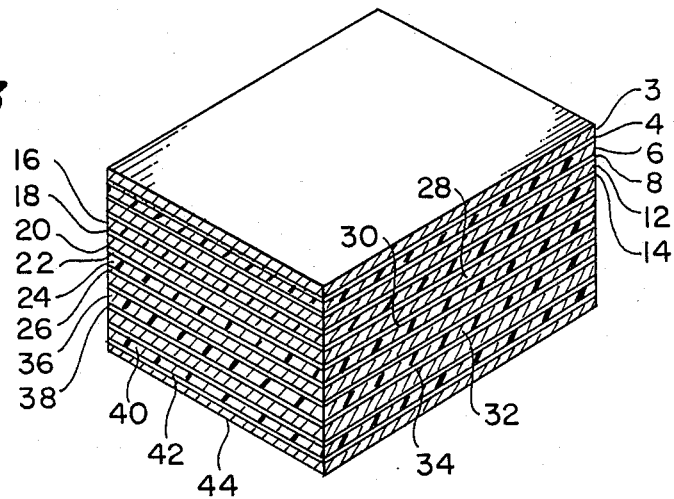
FIG. 3 is a fragmentary perspective view of a heat conducting laminate of the present invention.

FIG. 3 illustrates an embodiment of the present invention and shows a heat conducting laminate having alternating layers of metal bonded with an adhesive agent to layers of polymer matrix composite material having low-thermal-expansion reinforcing material embedded therein. In FIG. 3, layers 3, 12, 20, 28, 36 and 44 of metal, for example, aluminum and/or copper, are bonded by use of layers 4, 8, 14, 18, 22, 26, 30, 34, 38 and 42 of adhesive agent such as epoxy resin, to layers 6, 16, 24, 32 and 40 of polymer matrix composite material, for example, epoxy resin, having low-thermal-expansion reinforcing material, such as graphite fibers in the form of a woven fabric, distributed throughout each layer of epoxy resin. Many variations of the embodiment shown in FIG. 3 are possible in accordance with the present invention. For example, layers of adhesive agent are optional and may be excluded when layers of pre-cured polymer matrix material alternate with the layers of metal so that the layers of metal become bonded to the layers of polymer matrix composite material during a curing or post-curing step. As discussed above, it is also possible to provide laminates having acceptable heat transfer properties in accordance with the present invention where, for example, layers 3, 6, 12, 24, 36, 40 and 44 are layers of metal and/or metal alloys or mixtures thereof, and layers 16, 20, 28 and 32 are layers of the same or different polymer matrix materials having the same or different low-thermal-expansion reinforcing material embedded therein. It is also within the scope of the present invention to provide various layers, such as shown in FIG. 3, wherein the low-thermal-expansion reinforcing material embedded in the polymer matrix material to form the polymer matrix composite material, varies within at least two of the layers and may be fibers, whiskers, particles, non-woven mats, woven fabrics and mixtures thereof. For example, in FIG. 3, layers 16 and 32 may have a woven graphite fabric integrally incorporated in and distributed throughout the polymer matrix material as the low-thermal-expansion reinforcing material, and layers 20 and 28 may have graphite particles integrally incorporated in and distributed throughout the polymer matrix material as the low-thermal-expansion reinforcing material. Based upon the foregoing, it can be seen by one skilled in the art that a substantial number of variations in the layers of metal and layers of polymer matrix composite material as well as in the low-thermal-expansion reinforcing material incorporated in the polymer matrix material to form the polymer matrix composite material is possible by the present invention to form heat conducting laminates, laminated heat conducting devices and heat transfer devices for electronic components.

Figure 4:
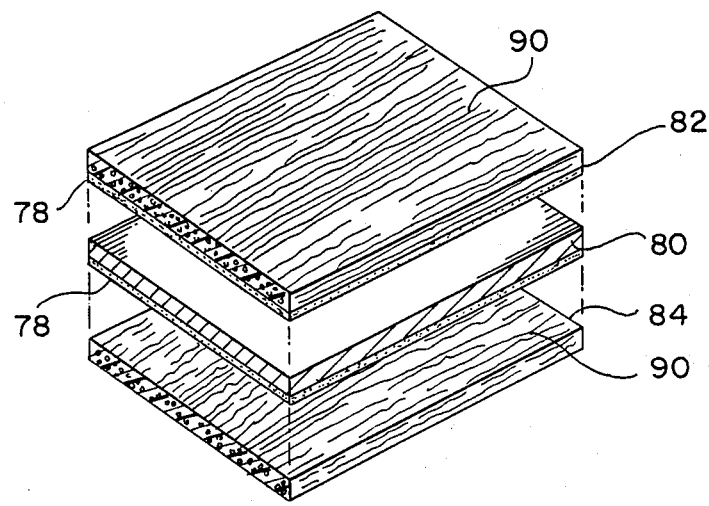
FIG. 4 is a fragmentary perspective view showing separated laminations to illustrate certain embodiments of the present invention.

FIG. 4 illustrates the laminated heat conducting devices and heat conducting laminates of the present invention in which the laminate contains at least one layer of polymer matrix composite material in which the low-thermal-expansion reinforcing material incorporated therein is thermally conductive and wherein it is aligned in a unidirectional orientation to direct heat generally in the direction of the alignment. As illustrated in FIG. 4, the layers of metal and polymer matrix composite material have been separated and shown in a cross-sectional perspective view in order to illustrate the orientation of the reinforcing material.

In FIG. 4, metal layer 80 is bonded to two layers 82 and 84 of polymer matrix composite material having low-thermal-expansion thermally conductive, reinforcing material 90 integrally incorporated in and distributed throughout the polymer matrix in a substantially unidirectional orientation within the polymer matrix composite. As illustrated, the reinforcing material 90 is in the form of fibers or filaments, however, the form of the unidirectionally aligned reinforcing material 90 is not critical in the practice of the present invention, and it is within the scope of the present invention to provide unidirectionally aligned, thermally conducting woven fabrics, non-woven mats, and particles as well as continuous fibers, filaments, whiskers and the like. Naturally, in those embodiments in which the reinforcing material 90 is not thermally conductive, then the laminated structure, although it is thermally conductive, is not generally one which will direct heat in the direction of the alignment. It is only when the reinforcing material 90 is thermally conductive as discussed above, that the aligned reinforcing material 90 directs heat in the direction of the alignment. When such alignment of thermally conductive reinforcing material is utilized, the polymer matrix composite material having the aligned reinforcing material embedded therein can be placed in the laminate so that heat within the laminated heat conducting device or heat conducting laminate can be dissipated substantially in the direction of the alignment. Generally, in this embodiment wherein the heat is directed in the direction of the alignment, the reinforcing material 90 is more thermally conductive than the polymer matrix material in which it is incorporated, and accordingly, the heat dissipated within the laminate, generally passes in the direction of the aligned, thermally conductive reinforcing material. In the embodiment shown in FIG. 4, adhesive agent 78 is disposed between the layers to bond the layers of metal and polymer matrix composite material to each other. However, it is within the scope of the present invention to bond the layers as shown in FIG. 4 without a separate adhesive agent by using the precured polymer matrix material as discussed above. Furthermore, FIG. 4 is not meant to be limiting insofar as only three layers are shown in the laminate, and it is within the scope of the present invention to arrange any number of layers in any sequence as desired as long as the reinforcing materials incorporated within the polymer matrix material to form a polymer matrix composite material are aligned unidirectionally and are distributed throughout the polymer matrix.

Figure 5:
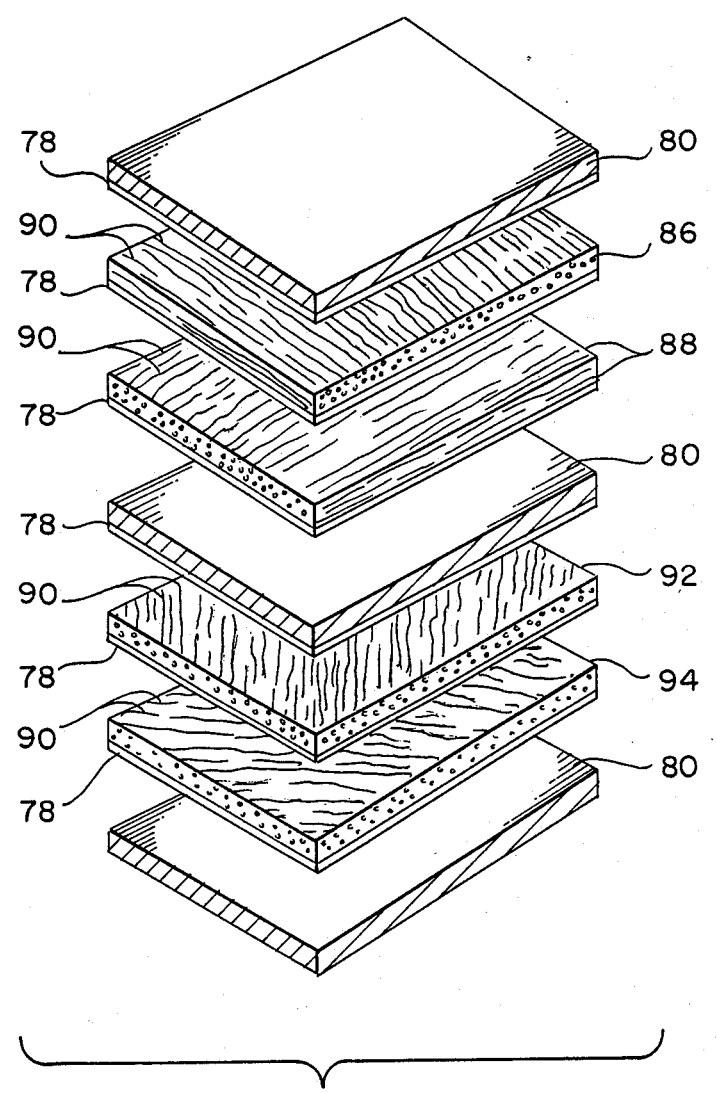
FIG. 5 is a fragmentary perspective view showing separated laminations to illustrate various other embodiments of the present invention.

FIG. 5 is another fragmentary perspective view showing partial cross-sections of separated laminations to illustrate other embodiments of the present invention, especially those embodiments in which the low-thermal-expansion reinforcing material is aligned or oriented within the polymer matrix material. In FIG. 5, layers 80, for example thin sheets of aluminum, are bonded to layers 86, 88, 92 and 94 of polymer matrix composite material having low-thermal-expansion reinforcing material 90 integrally incorporated or embedded therein and distributed throughout polymer matrix material 86, 88, 92 and 94. Adhesive layer 78 is shown as the bonding agent for bonding the layers in the sequence to each other.

As shown in FIG. 5, the reinforcing material 90 in layers 86 and 88 of polymer matrix composite material are orthogonal to each other, that is, the reinforcing material 90 in layer 86 is in an orthogonal orientation, that is, disposed at an angle of 90°, relative to the reinforcing material 90 in layer 88. In accordance with the present invention, the reinforcing material of at least one layer of the polymer matrix composite material is aligned at an angle up to 90° relative to the low-thermal-expansion reinforcing material of at least one other layer of polymer matrix composite material. Layers 92 and 94 of polymer matrix material having reinforcing material 90 substantially unidirectionally oriented therein illustrates another embodiment wherein reinforcing material 90 in layer 92 is aligned at an angle to the reinforcing material 90 of layer 94. In accordance with the present invention, reinforcing material 90 in layer 92 may be aligned at any angle relative to reinforcing material 90 in layer 94. As in FIG. 4 above, the layers of FIG. 5 may be placed in any sequence and any orientation as desired to obtain a heat conducting laminate, a laminated heat conducting device or a heat transfer device for electronic components having any desired coefficient of thermal expansion.

Although it is not specifically shown in all of the foregoing embodiments, the most preferred embodiments of the present invention having a plurality of layers are symmetrically disposed about a central plane.

For example, the embodiment shown in FIG. 5, in preferred embodiments, merely illustrates one-half of the layers of a laminated heat conducting device or heat conducting laminate, and to illustrate the preferred embodiments of FIG. 5 wherein there are a plurality of layers symmetrically disposed about a central plane, a laminated heat conducting device would comprise the following layers bonded together in the following sequence, for example, layers 80, 86, 88, 80, 92, 94, 80, 94, 92, 80, 88, 86 and 80 sequentially bonded to each other such that the layers would be symmetrically disposed about a central plane. As used herein, when the layers are symmetrically disposed about a central plane, the laminates are entirely symmetrical with a plane through the middle of the laminates and parallel to the plane of the metal sheets. It is also within the scope of the present invention to construct laminated heat conducting devices and heat conducting laminates which are not symmetrical with a plane parallel to the metal sheets such as the embodiment illustrated in FIG. 2.

Figure 6:
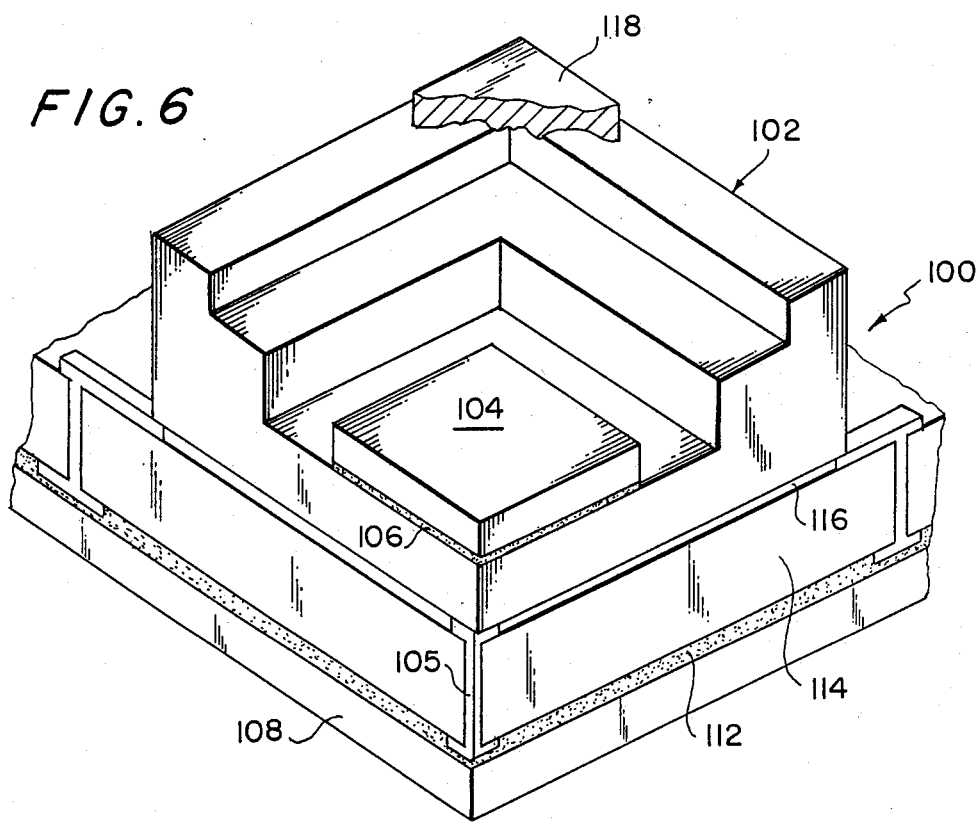
FIG. 6 is cutaway perspective view of a chip carrier packaging component and heat sink according to the present invention for a typical electronic circuit.
Figure 7:
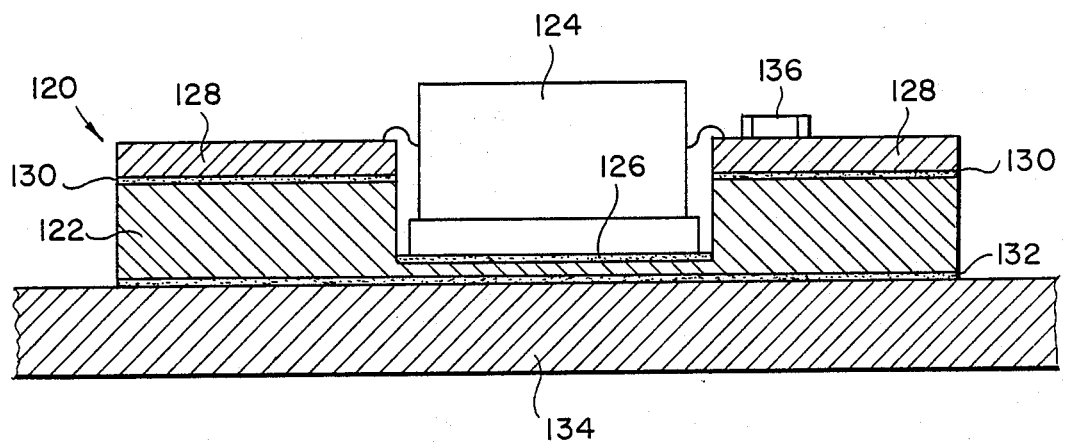
FIG. 7 is cross-sectional view of a field effect transistor packaging component and heat sink according to the present invention in a typical microwave circuit.

FIGS. 6 and 7 are representative of components which can utilize the laminated heat conducting devices or heat transfer devices of the present invention, and it is within the scope of the present invention to provide other components having other configurations and uses which incorporate the heat transfer devices, laminated heat conducting devices and heat conducting laminates of the present invention.

In FIG. 6, chip 104 is bonded to chip carrier 102 by solder or epoxy 106 as is well-known in the art. Chip carrier 102 is constructed of any suitable material, such as, a ceramic. Module 100 also comprises printed wiring board 114 separated from chip carrier 102 by air gap 116. Plated through-holes 105 located at the corners of chip carrier 102 provide the air gap. Printed wiring board 114 is bonded to heat sink 108 by adhesive 112. Heat sink 108 is made of the heat conducting laminates of the present invention, and accordingly, heat sink 108 is a laminated heat conducting device of the present invention. Heat sink 108 dissipates heat generated during the operation of the component.

Referring to FIG. 7, there is illustrated a typical microwave circuit or module 120 showing a package/heat sink configuration. Field effect transistor 124 is bonded to field effect transistor carrier 122 by suitable solder or epoxy 126. Carrier 122 is also bonded to ceramic substrate 128 on either side of field effect transistor 124 by solder or epoxy 130. Carrier 122 is also bonded to a chassis base or heat sink 134 by appropriate solder or epoxy 132. All of the elements of the microwave circuit 120 may be made of conventional material well-known in the art, and chassis base or heat sink 134 is a heat conducting laminate made in accordance with the present invention, and accordingly is a laminated heat conducting device of the present invention.

As shown in FIGS. 6 and 7, the coefficient of thermal expansion of heat sinks 108 and 134 substantially matches the coefficient of thermal expansion of substrates 114 and 122, respectively. As shown in FIG. 6, for example, when printed wiring board 114 has a coefficient of thermal expansion of, for example, $4.0 \times 10^{-6}$ in/in/°F., then the heat conducting laminate for heat sink 108 is made from a combination of at least one layer of metal and at least one layer of polymer matrix composite material adhered thereto, the polymer matrix composite material having low-thermal-expansion reinforcing material embedded therein, whereby the coefficient of thermal expansion and the thermal conductivity of the heat conducting device are defined by the metal in combination with the polymer matrix material and the low-thermal-expansion reinforcing material, which has a coefficient of thermal expansion substantially identical to or substantially matching the coefficient of thermal expansion, namely, $4.0 \times 10^{-6}$ in/in/°F. of printed wiring board 114. Chassis base or heat sink 134 in FIG. 7 is also fabricated by varying the low-thermal-expansion reinforcing material in the polymer matrix material to modify the coefficient of thermal expansion of the polymer matrix material and the heat transfer device and/or by varying the ratio of the polymer matrix composite material to the metal in the laminate to modify the coefficient of thermal expansion and the thermal conductivity of the heat transfer device. As discussed above, the low-thermal-expansion reinforcing material in the polymer matrix material can be varied by varying the type of reinforcing material, by varying the shape or form of the reinforcing material, by varying the amount of reinforcing material and by varying the orientation of the reinforcing material in the laminate.

Various additives, adjuvants and other materials may be incorporated in the heat conducting laminates or any of the elements or layers of the heat conducting laminates and laminated heat conducting devices of the present invention as long as they do not adversely effect the properties of the laminate or the circuits, modules, systems or other components in which they are used. For example, in certain cases it is well known in the art to coat the fibers, whiskers or particles with additives which promote the dispersion of the fibers, whiskers or particles in the polymer matrix material. It is also well-known in the art to incorporate additives which promote the curing of the polymer in the polymer matrix material.

Figure 8:
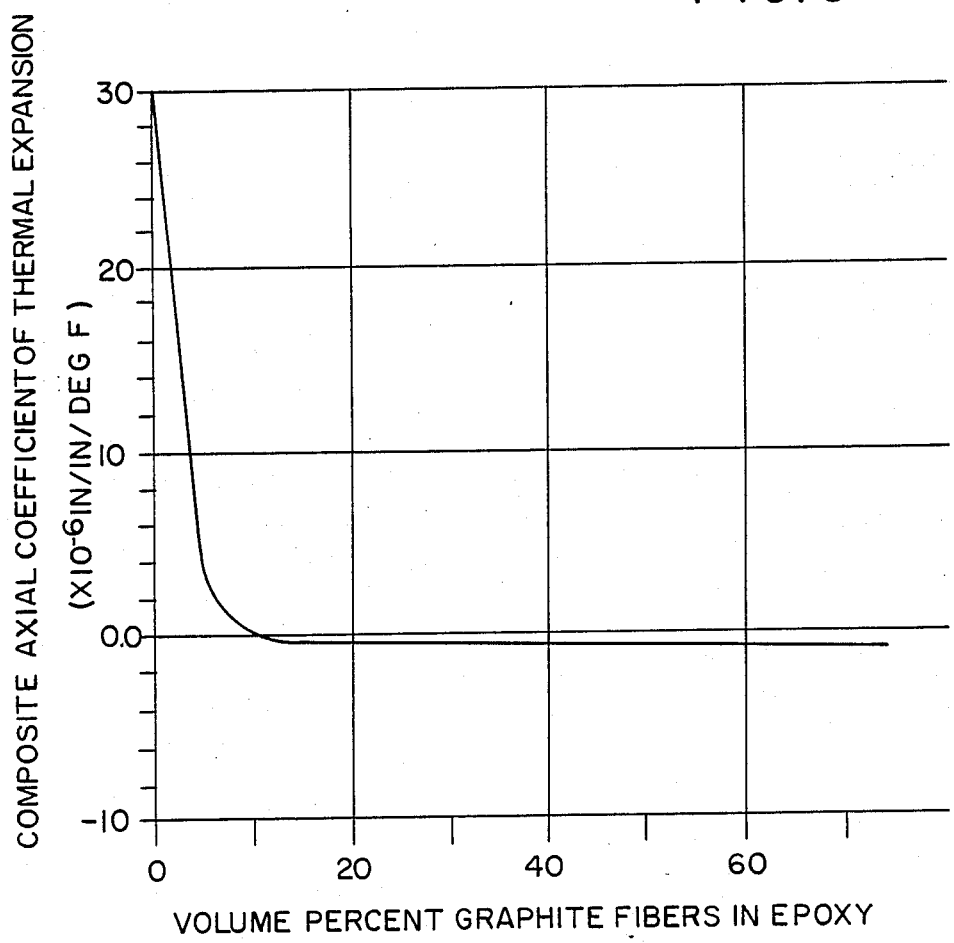
FIG. 8 is a graphical representation of the coefficient of thermal expansion as a function of graphite fiber reinforcement in an epoxy matrix material having graphite fiber incorporated therein.

FIG. 8 illustrates the dependency of the coefficient of thermal expansion of an epoxy resin having graphite fibers incorporated therein upon the volume percent of graphite fibers in the epoxy resin. The graphite fibers used in the computer analysis using laminated plate theory for the curve shown in FIG. 8 was a 100 million pound per square inch (psi) modulus fiber (the foregoing referring to Young's modulus). The computer-generated data of FIG. 8 clearly shows the effect on the axial CTE of the composite by varying the volume percent of graphite fibers in epoxy resin for graphite fibers having a unidirectional orientation in the epoxy resin and also having a Young's modulus of 100 million psi.

Although there is no desire to be bound by any theory or theoretical limitations, laminated plate theory may be used to determine the relative amounts of polymer matrix composite material and metal in the laminate to obtain a particular coefficient of thermal expansion and thermal conductivity. In those instances where properties of polymer matrix composite materials are not known, it is also possible to estimate the properties by using composites micromechanics theories.

FIG. 9 is a computer-generated graph which shows the coefficient of thermal expansion relative to the amount of aluminum in a laminate of aluminum and epoxy containing graphite fibers as the reinforcing material. The amount of graphite fiber in the epoxy resin was 60 volume percent for this data generated from laminated plate theory. In FIG. 9, five curves were generated for five different graphite fiber types. Curve 1 utilizes graphite fiber having a Young's modulus of 55 million pi. The graphite fibers for curve 2 have a Young's modulus of 75 million psi. Curves 3, 4 and 5 of FIG. 9 have a Young's modulus of 100 million psi, 120 million psi and 140 million psi, respectively. This graph permits the rapid estimation of the relative volume fractions of graphite/epoxy and aluminum required to yield a particular coefficient of thermal expansion. From the graph in FIG. 9, it can be determined that for a laminate of aluminum and epoxy containing 60 volume percent graphite fiber, to achieve a coefficient of thermal expansion of 7 parts per million (PPM)/° C. for the laminate, 28 volume percent aluminum is required in the laminate when the graphite fiber is the type having a Young's modulus of 55 million psi. It was also determined by the same analysis that the thermal conductivity of the laminate containing the graphite fiber having a Young's modulus of 55 million psi was 50 BTU/HR-FT-° F. For the graphite fiber having a Young's modulus of 75 million psi as shown in curve 2 of FIG. 9, 41 volume percent of aluminum is required in the laminate for a coefficient of thermal expansion of 7 PPM/° C., and the thermal conductivity of the sample is 70 BTU/HR-FT-° F. For curve 3, 50 volume percent of aluminum is required for a C.T.E. of 7 PPM/° C., and the laminate has a thermal conductivity of 110 BTU/HR-FT-° F. For curve 4, 54 volume percent aluminum is required for a C.T.E. of 7 PPM/° C., and the thermal conductivity of the laminate increases to 119 BTU/HR-FT-° F. For curve 5, 61 volume percent aluminum is required for a C.T.E. of 7 PPM/° C., and the thermal conductivity is 132 BTU/HR-FT-° F. It is noted that the thermal conductivity of unreinforced 1100 aluminum is 128 BTU/HR-FT-° F.

From data actually generated from laboratory tests, it has been determined that the actual test data generally coincides with the data set forth in the computer-generated graphs of FIGS. 8 and 9. From the foregoing, it is also possible to fabricate thermally conducting heat transfer devices so that the heat transfer device has a coefficient of thermal expansion substantially matching the coefficient of thermal expansion of elements adjacent to the heat transfer device. For example, in the data from FIG. 9 above, it is possible to determine the amount of aluminum required in a laminate containing aluminum and epoxy resin having 60 volume percent graphite fiber incorporated therein for various types of graphite fiber. To fabricate a cold plate for an electronic device, such as, a printed wiring board and a leadless ceramic chip carrier which has a coefficient of thermal expansion of 7.0 PPM/° C., a cold plate made of the laminate as set forth in FIG. 9 and having a 7.0 PPM/° C. coefficient of thermal expansion can be prepared to closely match the coefficient of thermal expansion of the printed wiring board and the leadless ceramic chip carrier.

The following specific embodiments of heat transfer devices made in accordance with the present invention are presented for purposes of illustration only, and the details therein should not be construed as limitations upon the true scope the invention as set forth in the claims.

Heat sinks made from a composite of epoxy resin and graphite fibers having a Young's modulus of 100 million psi and aluminum foil were fabricated as set forth below. The heat sink was fabricated substantially as shown in FIG. 1 and had a cross-section substantially as shown in FIG. 2.

The laminate for the heat sink was made by a process utilizing a combination of an autoclave-vacuum bagging process well-known in the art to manufacture laminates. The process utilized caul plates with autoclave heat and pressure application to manufacture the laminates. Suitable release materials were placed upon the upper and lower plates. For example, the caul was placed on a sheet of bagging material large enough to encompass and seal the entire assembly and a sheet of teflon-coated glass fabric was placed on the caul plate. Sheets of aluminum foil having a thickness of 8 mils, and sheets of graphite fiber epoxy resin impregnated tape having the graphite fiber in a unidirectional orientation distributed throughout the epoxy resin, otherwise known as a "prepreg", having a thickness of 5 mils were placed on the teflon-coated glass fabric in the sequence shown in FIG. 2. A conventional silicone rubber dam was placed around the periphery of the "prepreg" tape. The complete lay-up of alternating sheets of "prepreg" and aluminum was covered with a layer of porous release cloth, and another sheet of teflon-coated glass cloth was placed on the porous release cloth. This in turn was covered with the steel cover plate, and the vacuum bagging material was folded over the laminate and sealed after inserting a vacuum tube therein. Vacuum was applied at 29 inches Hg, and the laminate was cured in the autoclave at 100 PSIG. Curing was carried out from room temperature to 250° F. at increments of 3–6° F. per minute, and the temperature was held at 250° F. for 1.5 hours. Heating was discontinued; the vacuum was vented to atmosphere; and the laminate was allowed to cool under pressure. The laminate was removed and subjected to various tests.

All-metal heat sinks were prepared to compare the properties of the conventional heat sinks with the laminate prepared above. A boron-aluminum heat sink and a copper-Invar®-copper heat sink were also prepared for comparison.

The heat sinks were bonded to printed wiring boards having leadless ceramic chip modules by using silicone rubber to bond the heat sinks to the boards. They were then subjected to thermal cycle testing between −55° C. and +95° C. Coefficient of thermal expansion measurements were made on all of the boards after assembly and soldering and again after bonding of the boards to the heat sinks. Wide ranges in C.T.E. for a given sample were largely due to differences in C.T.E. measured in the X and in the Y directions.

The coefficient of thermal expansion measurements show that the variations in board construction did not have a significant effect on coefficient of thermal expansion but that use of a low C.T.E. heat sink made a considerable difference in the C.T.E. at the board surface. The use of a rigid bonding material in conjunction with a low C.T.E. heat sink was particularly effective in reducing the C.T.E. of the assembly. The results show the advantage of a low C.T.E. heat sink in reducing module C.T.E. and obtaining extended solder joint life. The modules with aluminum heat sinks had the poorest results, and the modules with copper-Invar®-copper heat sinks had the best results. However, modules with the graphite-epoxy/aluminum heat sinks prepared above performed satisfactorily but did not do as well as expected because the measured C.T.E. of the heat sinks range from 7 to 14 PPM/° C. rather than the expected 7 PPM/° C. It is believed that the foregoing was due to the non-symmetrical lamination which may be related to observed microcracking.

It has been demonstrated that heat transfer devices for electronic components can be fabricated from bonding at least one layer of metal to at least one layer of polymer matrix composite material having low-thermal-expansion reinforcing material embedded therein. It can also be seen from the present invention that the coefficient of thermal expansion and thermal conductivity of a heat conducting device can be controlled by bonding at least one layer of metal to at least one layer of polymer matrix composite material having low-thermal-expansion reinforcing material integrally incorporated or embedded therein whereby the coefficient of thermal expansion and thermal conductivity are defined by the metal in combination with the polymer matrix composite material and the low-thermal-expansion reinforcing material.

While other modifications of the invention and variations thereof which may be employed within the scope of the invention, have not been described, the invention is intended to include such modifications as may be embraced within the following claims.

What is claimed is:

1. A heat conducting laminate comprising at least one layer of metal and at least one layer of thermoset polymer matrix composite material having low-thermal-expansion reinforcing material embedded therein.

2. The heat conducting laminate of claim 1 wherein the low-thermal-expansion reinforcing material is selected from the group consisting of inorganic fibers, inorganic whiskers, inorganic particles, organic fibers, organic whiskers and mixtures thereof.

3. The heat conducting laminate of claim 2 wherein the reinforcing material has a unidirectional orientation throughout the layer of polymer matrix composite material.

4. The heat conducting laminate of claim 2 wherein the reinforcing material is randomly distributed throughout the layer of polymer matrix composite material.

5. The heat conducting laminate of claim 2 wherein the organic fibers or whiskers are selected from the group consisting of polyaramid fibers or whiskers and PBT fibers or whiskers.

6. The heat conducting laminate of claim 2 wherein the fibers are in the form of a woven fabric or nonwoven mat.

7. The heat conducting laminate of claim 1 at least one layer of metal and at least one layer of an ordered polymer film having low-thermal-expansion reinforcing material embedded therein said low-thermal-expansion reinforcing material being orientated portions of the polymer itself within said ordered polymer film.

8. The heat conducting laminate of claim 7 wherein the ordered polymer film is selected from the group consisting of polyaramid and PBT.

9. The heat conducting laminate of claim 1 wherein the low-thermal-expansion reinforcing material is inorganic fibers selected from the group consisting of carbon, graphite, boron, alumina, silicon carbide, boron carbide, boria, boron nitride, silica, titanium diboride, beryllium, quartz, alumina-boria silica and mixtures thereof.

10. The heat conducting laminate of claim 1 wherein the low-thermal-expansion reinforcing material is inorganic whiskers selected from the group consisting of carbon, graphite, boron, alumina, silicon carbide, boron carbide, boria, boron nitride, silica, titanium diboride, beryllium, quartz, alumina-boria silica, silicon nitride, nickel aluminide and mixtures thereof.

11. The heat conducting laminate of claim 1 wherein the low-thermal-expansion reinforcing material is inorganic particles selected from the group consisting of carbon, graphite, boron, alumina, silicon carbide, boron carbide, boria, boron nitride, silica, titanium diboride, beryllium, quartz, alumina-boria silica, nickel aluminide, silicon nitride, beryllium oxide, aluminum nitride, titanium carbide, aluminum dodecaboride, tungsten carbide, chromium carbide, molybdenum disilicide, hollow glass spheres, hollow quartz spheres, hollow graphite spheres and mixtures thereof.

12. The heat conducting laminate of claim 1 wherein the coefficient of thermal expansion of the reinforcing material is less than the coefficient of thermal expansion of the metal.

13. The heat conducting laminate of claim 1 wherein the coefficient of thermal expansion of the layer of polymer matrix composite material having low-thermal-expansion reinforcing material embedded therein is less than the coefficient of thermal expansion of the metal.

14. The heat conducting laminate of claim 1 wherein the low-thermal-expansion reinforcing material is thermally conductive.

15. The heat conducting laminate of claim 14 wherein the thermally conductive, low-thermal-expansion reinforcing material is aligned in the polymer matrix composite material to direct heat in the direction of the alignment.

16. The heat conducting laminate of claim 14 wherein the thermally conductive, low-thermal-expansion reinforcing material is particles, whiskers, fibers, fabrics, mats or any combination of particles, whiskers, fibers, fabrics or mats selected from the group consisting of carbon, graphite, boron, alumina, silicon carbide, titanium diboride, beryllium, nickel aluminide, aluminum nitride, aluminum dodecaboride, molybdenum disilicide and mixtures thereof.

17. A laminated heat conducting device comprising at least one layer of metal and at least one layer of a thermoset polymer matrix composite material adhered thereto, the polymer matrix composite material having low-thermal-expansion reinforcing material embedded therein, whereby the coefficient of thermal expansion and the thermal conductivity of the device are defined by the metal in combination with the polymer matrix material and the low-thermal-expansion reinforcing material, and the coefficient of thermal expansion of the laminated device is less than the coefficient of thermal expansion of the metal.

18. The laminated heat conducting device of claim 17 comprising alternating layers of metals and polymer matrix composite material.

19. The laminated heat conducting device of claim 17 comprising a plurality of layers symmetrically disposed about a central plane.

20. The laminated heat conducting device of claim 17 wherein the low-thermal-expansion reinforcing material in at least one layer of polymer matrix composite material has a unidirectional orientation.

21. The laminated heat conducting device of claim 17 wherein the low-thermal-expansion reinforcing material in at least one layer of polymer matrix composite material is randomly distributed therein.

22. The laminated heat conducting device of claim 17 having a plurality of polymer matrix composite material layers wherein the low-thermal-expansion reinforcing material of at least one of the polymer matrix composite material layers is aligned at an angle up to 90° relative to the low-thermal-expansion reinforcing material of at least one other polymer matrix composite material layer.

23. The laminated heat conducting device of claim 22 wherein the low-thermal-expansion reinforcing material in one layer is in an orthogonal orientation relative to the low-thermal-expansion reinforcing material of another layer.

24. The laminated heat conducting device of claim 17 wherein the low-thermal-expansion reinforcing material in at least one layer of polymer matrix composite material is thermally conductive.

25. The laminated heat conducting device of claim 24 wherein the thermally conductive, low-thermal-expansion reinforcing material is aligned in the polymer matrix composite material to direct heat in the direction of the alignment.

26. The laminated heat conducting device of claim 24 wherein the thermally conductive, low-thermal-expansion reinforcing material is particles, whiskers, fibers, fabrics or any combination of particles, whiskers, fibers or fabrics selected from the group consisting of carbon, graphite, boron, alumina, silicon carbide, titanium diboride, beryllium, nickel aluminide, aluminum nitride, aluminum dodecarboride, molybdenum disilicide, hollow graphite spheres and mixtures thereof.

27. The laminated heat conducting device of claim 17 having a plurality of polymer matrix composite material layers wherein at least two of the polymer matrix composite material layers have different low-thermal-expansion reinforcing materials embedded therein.

28. The laminated heat conducting device of claim 17 having a plurality of metal layers wherein at least two of the metal layers are different metals.

29. The laminated heat conducting device of claim 17 having a plurality of polymer matrix material layers wherein at least two of the polymer matrix composite material layers are different polymers.

30. The laminated heat conducting device of claim 29 wherein at least two of the polymer matrix composite material layers have different low-thermal-expansion reinforcing materials embedded therein.

31. The laminated heat conducting device of claim 17 having a plurality of metal layers and a plurality of polymer matrix composite material layers wherein at least two of the metal layers are different metals and at least two of the polymer matrix composite material layers are different polymers.

32. The laminated heat conducting device of claim 17 wherein the low-thermal-expansion reinforcing material which in combination with the polymer matrix material and the metal modify the coefficient of thermal expansion of the device, is in a form or shape selected from the group consisting of fibers, whiskers, particles, fabrics, mats and mixtures thereof.

33. The laminated heat conducting device of claim 17 wherein the low-thermal-expansion reinforcing material which in combination with the polymer matrix material and the metal modify the coefficient of thermal expansion of the device, is selected from the group consisting of polyaramid fibers and PBT.

34. The laminated heat conducting device of claim 17 wherein the low-thermal-expansion reinforcing material which, in combination with the polymer matrix material and the metal modify the coefficient of thermal expansion of the device, is inorganic fibers selected from the group consisting of carbon, graphite, boron, alumina, silicon carbide, boron carbide, boria, boron nitride, silica, titanium diboride, beryllium, quartz, alumina-boria silica and mixtures thereof.

35. The laminated heat conducting device of claim 17 wherein the low-thermal-expansion reinforcing material which in combination with the polymer matrix material and the metal modify the coefficient of thermal expansion of the device, is inorganic whiskers selected from the group consisting of carbon, graphite, boron, alumina, silicon carbide, boron carbide, boria, boron nitride, silica, titanium diboride, beryllium, quartz, alumina-boria silica, silicon nitride, nickel aluminide and mixtures thereof.

36. The laminated heat conducting device of claim 17 wherein the low-thermal-expansion reinforcing material which, in combination with polymer matrix material and the metal modify the coefficient of thermal expansion of the device, is inorganic particles selected from the group consisting of carbon, graphite, boron, alumina, silicon carbide, boron carbide, boria, boron nitride, silica, titanium diboride, beryllium, quartz, alumina-boria silica, nickel aluminide, silicon nitride, beryllium oxide, aluminum nitride, titanium carbide, aluminum dodecaboride, tungsten carbide, chromium carbide, molybdenum disilicide, hollow glass spheres, hollow quartz spheres, hollow graphite spheres and mixtures thereof.

37. The laminated heat conducting device of claim 17 wherein at least one layer is perforated to promote bonding of the adjacent layers to each other.

* * * * *

UNITED STATES PATENT AND TRADEMARK OFFICE
CERTIFICATE OF CORRECTION

PATENT NO. : 4,888,247

DATED : December 19, 1989

INVENTOR(S) : Carl H. Zweben et al.

It is certified that error appears in the above-identified patent and that said Letters Patent is hereby corrected as shown below:

Column 2, line 28, "oxide" should be --oxides--.

Column 3, line 6, after "coefficient" insert --of--.

Column 3, line 7, delete "of" (first occurrence).

Column 20, line 68, "pi." should be --psi.--.

Column 23, line 46, "The" should be --A--.

Column 23, line 46, "of claim 1" should be --comprising--.

Column 23, line 49, after "therein" insert a comma (,).

Signed and Sealed this

Eleventh Day of December, 1990

Attest:

HARRY F. MANBECK, JR.

*Attesting Officer*   *Commissioner of Patents and Trademarks*